United States Patent
Van Houdt et al.

(10) Patent No.: US 10,672,894 B2
(45) Date of Patent: Jun. 2, 2020

(54) METHOD OF FABRICATING FERROELECTRIC FIELD-EFFECT TRANSISTOR

(71) Applicant: IMEC vzw, Leuven (BE)

(72) Inventors: Jan Van Houdt, Bekkevoort (BE); Hanns Christoph Adelmann, Wilsele (BE); Han Chung Lin, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/216,833

(22) Filed: Dec. 11, 2018

(65) Prior Publication Data
US 2019/0198638 A1    Jun. 27, 2019

(30) Foreign Application Priority Data
Dec. 22, 2017    (EP) .................................... 17210418

(51) Int. Cl.
*H01L 29/66* (2006.01)
*H01L 29/51* (2006.01)
(Continued)

(52) U.S. Cl.
CPC .... *H01L 29/6684* (2013.01); *H01L 21/02356* (2013.01); *H01L 29/1606* (2013.01);
(Continued)

(58) Field of Classification Search
None
See application file for complete search history.

(56) References Cited

U.S. PATENT DOCUMENTS 8,304,823 B2 * 11/2012 Boescke ............... G11C 11/22
257/295
8,455,861 B2 *  6/2013 Lin ..................... H01L 29/1606
257/29
(Continued)

FOREIGN PATENT DOCUMENTS

CN    106910776 A    6/2017
JP    2016-213280 A    12/2016

OTHER PUBLICATIONS

Hong et al., "High-Mobility Few-Layer Graphene Field Effect Transistors Fabricated on Epitaxial Ferroelectric Gate Oxides", Physical review letters, vol. 102, No. 13, Oct. 2008, in 5 pages.
(Continued)

*Primary Examiner* — Shaun M Campbell
(74) *Attorney, Agent, or Firm* — Knobbe, Martens, Olson & Bear LLP

(57) ABSTRACT

The disclosed technology generally relates to methods of fabricating a semiconductor device, and more particularly to methods of fabricating a ferroelectric field-effect transistor (FeFET). According to one aspect, a method of fabricating a FeFET includes forming a layer stack on a gate structure, wherein forming the layer stack comprises a ferroelectric layer followed by forming a sacrificial stressor layer. The method additionally includes heat-treating the layer stack to cause a phase transition in the ferroelectric layer. The method additionally includes, subsequent to the heat treatment, replacing the sacrificial stressor layer with a two-dimensional (2D) material channel layer. The method further includes forming a source contact and a drain contact contacting the 2D material channel layer.

20 Claims, 4 Drawing Sheets

(51) Int. Cl.
*H01L 29/16* (2006.01)
*H01L 29/78* (2006.01)
*H01L 21/02* (2006.01)

(52) U.S. Cl.
CPC ...... *H01L 29/516* (2013.01); *H01L 29/66045* (2013.01); *H01L 29/66545* (2013.01); *H01L 29/66795* (2013.01); *H01L 29/66969* (2013.01); *H01L 29/78391* (2014.09)

(56) References Cited

U.S. PATENT DOCUMENTS

| | | | |
|---|---|---|---|
| 9,543,322 | B2 | 1/2017 | Park et al. |
| 9,559,168 | B2 | 1/2017 | Lai et al. |
| 2009/0057737 | A1* | 3/2009 | Boescke ............... H01L 28/40 257/295 |
| 2012/0112166 | A1* | 5/2012 | Lin ..................... H01L 29/1606 257/29 |
| 2012/0305891 | A1 | 12/2012 | Nayfeh et al. |
| 2017/0098713 | A1 | 4/2017 | Gu et al. |
| 2019/0096767 | A1* | 3/2019 | Yeh ................... H01L 21/02181 |

OTHER PUBLICATIONS

Lee et al., "High-performance a $MoS_2$ Nanosheet-based Nonvolatile Memory Transistor with a Ferroelectric Polymer and Graphene Source-Drain Electrode", Journal of the Korean Physical Society, Vo. 67, No. 9, Nov. 2015, pp. L1499-L1503.

McGuire et al., "$MoS_2$ Negative Capacitance FETS with CMOS-Compatible Hafnium Zirconium Oxide", 75th Annual Device Research Conference (DRC), IEEE, 2017, in 2 pages.

Schatz et al., "Pulsed laser deposition of piezoelectric lead zirconate titanate thin films maintaining a post-CMOS compatible thermal budget", Journal of Applied Physics, vol. 122, 2017, pp. 114502-1-114502-8.

Zhang et al, "Electrical Stress and Total Ionizing Dose Effects on Graphene-Based Non-Volatile Memory Devices", IEEE Transactions on Nuclear Science, vol. 59, No. 6, Dec. 2012, pp. 2974-2978.

Zhou et al., "Ferroelectric-Gated Two-Dimensional-Material-Based Electron Devices", Advanced Electronic Materials, vol. 3, 2017, in 16 pages.

Extended European Search Report dated Jun. 5, 2018 of European Patent Application No. 17210418.4, in 9 pages.

* cited by examiner

METHOD OF FABRICATING FERROELECTRIC FIELD-EFFECT TRANSISTOR

CROSS-REFERENCE TO RELATED APPLICATIONS

This application claims foreign priority to European Patent Application No. 17210418.4, filed Dec. 22, 2017, the content of which is incorporated by reference herein in its entirety.

BACKGROUND

Field

The disclosed technology generally relates to methods of fabricating a semiconductor device, and more particularly to methods of fabricating a ferroelectric field-effect transistor.

Description of the Related Technology

As physical scaling of semiconductor continues, an increasing number of devices having alternative structures or materials are proposed to augment or replace the traditional transistor architecture. One category of emerging devices includes a ferroelectric field-effect transistor (FeFET). A ferroelectric field-effect transistor (FeFET) is a device that is gaining increasing interest for various applications, including memory and storage applications. In some FeFET architectures, instead of or in addition to a conventional gate dielectric layer between the gate and the channel, the FeFET includes a ferroelectric layer.

Another category of emerging devices includes transistors employing a two-dimensional (2D) material layer, e.g., as or part of a channel. Some 2D materials show promise as an enabling technology for even faster, more power efficient and smaller electronic devices. Graphene and transition metal dichalcogenide materials (TMDCs) are notable examples of 2D materials.

SUMMARY OF CERTAIN INVENTIVE ASPECTS

An objective of the present inventive concept is to provide a method enabling forming of a FeFET device with a 2D material channel layer. Further and alternative objectives may be understood from the following.

According to an aspect of the disclosed technology, a method of fabricating a FeFET device comprises: forming a layer stack on a gate structure, the layer stack including a ferroelectric layer and a sacrificial stressor layer, wherein the sacrificial stressor layer is formed subsequent to forming the ferroelectric layer; subjecting the layer stack to a heat treatment to cause a phase transition in the ferroelectric layer; subsequent to the heat treatment, replacing the sacrificial stressor layer by a two-dimensional material channel layer; and forming a source contact and a drain contact in contact with the 2D material channel layer.

The disclosed technology is based on an insight by the inventors with respect to some advantages that can be offered by a FeFET device having a two-dimensional (2D) material channel layer according to embodiments, and a method of fabricating the FeFET device. For example, the inventors have recognized that, in fabrication of a FeFET device with a channel in a two-dimensional (2D) material layer, the presence of a sacrificial stressor layer may, e.g., during a heat treatment, provide improved control of the phase transition in the ferroelectric layer. More specifically, the sacrificial stressor layer may (in combination with the heat treatment) cause or induce a phase transition in the ferroelectric layer to a ferroelectric phase or ferroelectric state. The sacrificial stressor layer may contribute to the phase transition by inducing stress in the ferroelectric layer.

Additionally, in some embodiments, a relatively high temperature heat treatment may be performed while the sacrificial stressor layer is present on the ferroelectric layer. The heat treatment may improve device performance by annealing the ferroelectric layer. As described further below, the annealing process may increase or induce ferroelectricity exhibited by the ferroelectric layer. However, the 2D material channel layer may be adversely affected if subjected to the same heat treatment. Thus, it can be advantageous to perform such heat treatment in the absence of the 2D material. Advantageously, according to embodiments, the sacrificial stressor layer, and not the 2D material channel layer, may be present and subjected to the heat treatment, such that the 2D material channel layer is prevented from being exposed to the (potentially high and detrimental) thermal budget of the heat treatment. Anyway, the 2D material channel layer may not, during the heat treatment, provide a significant stress-inducing function with respect to the ferroelectric layer.

Additionally, the 2D material channel layer may advantageously be formed subsequent to forming the gate structure, according to some embodiments. In these embodiments, as the gate structure already may advantageously be in place when replacing the sacrificial stressor layer with the 2D material channel layer, exposure of the 2D material channel layer to adverse process conditions may be further reduced. As an illustrative example, in process architectures where the gate structure is deposited subsequent to the 2D material channel layer (for instance on top of the 2D material channel layer), the deposition of the gate structure could cause damage and adversely exert stress to the 2D material channel layer.

In view of the above, it may be understood that the method provides the advantage of providing advantageous control over the ferroelectric properties of the ferroelectric layer without being limited by the thermal budget that can be endured by the 2D material.

As used herein, a ferroelectric layer refers to a layer of material which has a phase or a state where the layer exhibits ferroelectricity (at least when held at a temperature below the Curie temperature of the material forming the ferroelectric layer). The ferroelectric layer may, but need not, exhibit ferroelectricity prior to the heat treatment. In any case, the ferroelectric layer may subsequent to the heat treatment exhibit ferroelectricity (i.e. subsequent to having cooled to a temperature below the Curie temperature).

In some embodiments where the ferroelectric layer exhibits a degree of ferroelectricity prior to the heat treatment, the ferroelectric layer may subsequent to the heat treatment exhibit an increased degree of ferroelectricity.

The heat treatment may be such that the at least a portion (preferably at least a major portion) of the ferroelectric layer, subsequent to the heat treatment, is in a ferroelectric state (i.e., exhibits ferroelectricity).

The heat treatment may include heating the ferroelectric layer to a temperature exceeding the Curie temperature of the material forming the ferroelectric layer.

The ferroelectric layer may be subjected to a temperature in a range of 300° C. to 1200° C., 500° C. to 1000° C., 600° C. to 900° C., or a range defined by any of these values.

The method may further comprise, subsequent to the heat treatment, allowing ferroelectric layer to cool prior to replacing the sacrificial stressor layer with the 2D material channel layer. Thermally induced stress on the 2D material channel layer may thereby be reduced.

The sacrificial stressor layer may include a metal layer. The sacrificial stressor layer may be a metal layer. Metal-based stressors may induce an advantageous amount of stress in the ferroelectric layer during the heat treatment. A metal layer may also withstand high thermal budget process steps.

The metal layer may include a transition metal nitride, e.g., titanium nitride. The metal layer may be a titanium nitride layer. A titanium nitride layer may induce an advantageous amount of stress in the ferroelectric layer during the heat treatment. Moreover, processes exist for removing a metal layer with a comparably high selectivity to the ferroelectric layer. Alternatively, the metal layer may include tantalum nitride or titanium tantalum nitride, or be a layer of, tantalum nitride or titanium tantalum nitride.

It will be appreciated that ferroelectricity and/or the gate capacitance may be dependent on the thickness of the ferroelectric layer. The ferroelectric layer may be formed with a thickness in the range of 2 nm to 20 nm, preferably 2 nm to 8 nm. A thickness in this range, and to an even greater extent in the latter more narrow range, enables the ferroelectric layer to be formed with ferroelectric properties, e.g., a suitable amount of ferroelectricity, while still allowing a sufficient gate-to-channel capacitance for gate control of the channel.

The replacing of the sacrificial stressor layer by the two-dimensional material channel layer may comprise removing the sacrificial stressor layer from the layer stack and thereafter forming the two-dimensional material channel layer. The sacrificial stressor layer may be removed by etching the sacrificial stressor layer selectively to the other layers of the layer stack.

The ferroelectric layer may include hafnium oxide, zirconium oxide, hafnium titanate, hafnium zirconium oxide or a combination thereof. These oxides may present advantageous ferroelectric properties, as well as enable a low leakage current densities, even at comparably small thicknesses. The ferroelectric layer may optionally be formed to include dopants. Dopants may facilitate a transition of the ferroelectric layer material to a ferroelectric phase.

The 2D material channel layer comprises a layered material and may include one or more mono-layers of a transition metal dichalcogenide (TMDC) material or one or more mono-layers of graphene.

The 2D material channel layer may include one or more mono-layers of $WS_2$, $WSe_2$, $MoS_2$, $MoSe_2$, $WTe_2$ or $MoTe_2$. These TMDC materials enable transistor devices with advantageous electrical properties.

It will be appreciated that the method according to embodiments is compatible with both a vertical layer stack configuration as well as a lateral layer stack configuration.

Hence, according to one embodiment, the gate structure is arranged on a substrate and presents an upper surface extending along a plane parallel to a main surface of the substrate, and wherein the layer stack is formed on the upper surface, wherein the ferroelectric layer is formed above the gate structure and the sacrificial stressor layer is formed above the ferroelectric layer.

According to an alternative embodiment, the gate structure is arranged on a substrate having a semiconductor structure extending vertically from the substrate, the semiconductor structure having a sidewall surface on which the gate structure is arranged.

The gate structure may be a sacrificial or dummy gate structure wherein the method may further comprise replacing the dummy gate structure with=a replacement gate structure. This may be particularly advantageous for aforementioned lateral configuration.

Alternatively, the gate structure may be a gate electrode (formed of, e.g., a conductive material, such as a metal).

The layer stack may further include a high-K dielectric layer formed subsequent to forming the ferroelectric layer. An effective capacitive coupling between the gate and the channel may thereby be increased. The high-K dielectric layer may be formed prior to forming the sacrificial stressor layer. Thereby, exposure of the heat treated ferroelectric layer to the high-K formation process conditions may thereby be avoided.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

A method for forming an FeFET device 100 will now be described with reference to FIGS. 1-5.

Figure 1:
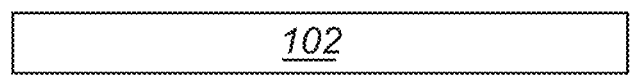
FIGS. 1-5 schematically illustrate intermediate structures at different steps of fabrication of a FeFET device.
Figure 2:
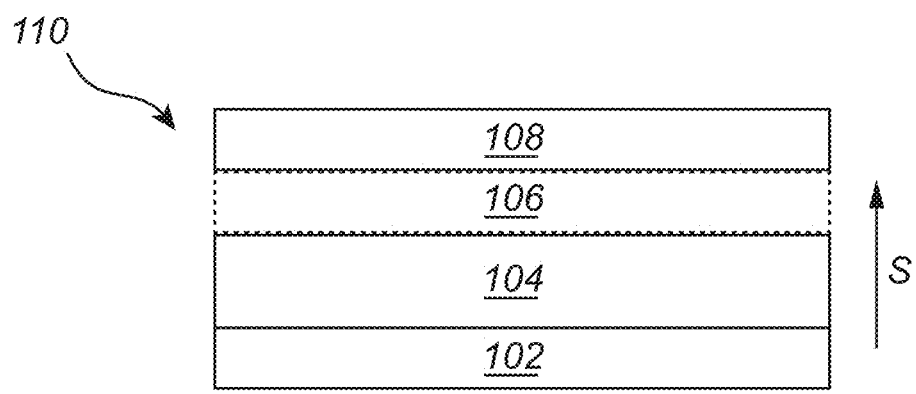

FIG. 1 schematically shows a gate structure 102. In FIG. 2, a layer stack 110 has been formed on the gate structure 102. The layer stack includes a ferroelectric layer 104 and a sacrificial stressor layer 108. The direction S shown in FIG. 2 indicates the order in which the layers of the layer stack 110 can be formed, e.g., the stacking direction S. Accordingly, in the illustrated embodiment, the sacrificial stressor layer 108 is formed subsequent to forming the ferroelectric layer 104. Depending on the geometry of the device, the stacking direction S may in relation to a main surface of an underlying substrate (not shown) be oriented parallel to a normal direction of the main surface or be oriented parallel to the main surface (at least a major component of the direction S may be parallel to the normal direction or the main surface). Optionally, forming of the layer stack 110 may further comprise forming a high-K dielectric layer 106 subsequent to forming the ferroelectric layer 104 and prior to forming the stressor layer 108. Upon formation of the sacrificial stressor layer 108, the high-K dielectric layer 106 may hence be sandwiched between the ferroelectric layer 104 and the sacrificial stressor layer 108.

Figure 3:
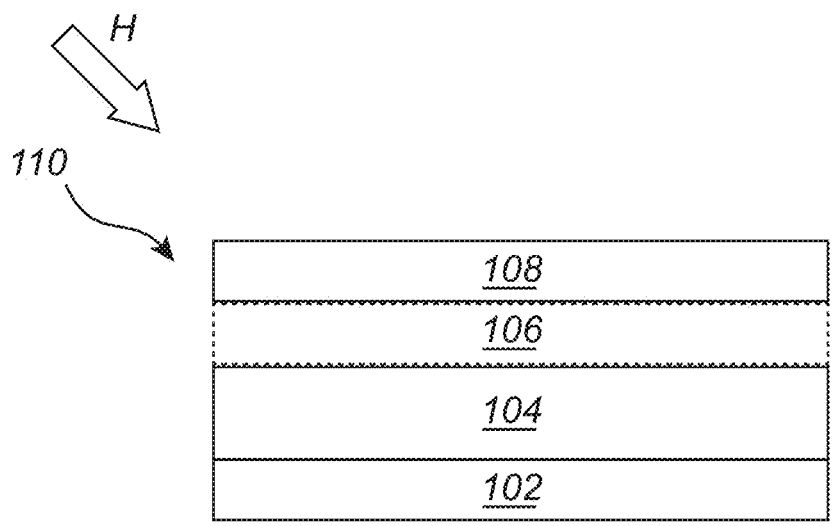

FIG. 3 schematically shows the layer stack 110 being subjected to a heat treatment H. During the heat treatment H a phase transition may be caused in the ferroelectric layer 104. Thereby the ferroelectric layer 104 may obtain a ferroelectric state. However, embodiments are not so limited and in other embodiments, the ferroelectric layer 104 may have a degree of ferroelectricity prior to the heat treatment H, and the heat treatment H may increase the degree of the ferroelectricity.

Figure 4:
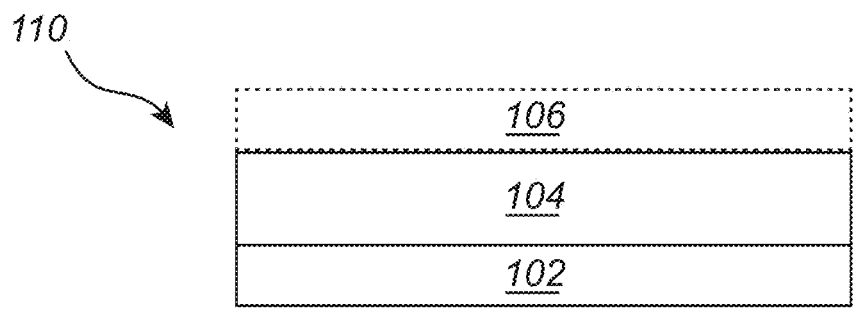
Figure 5:
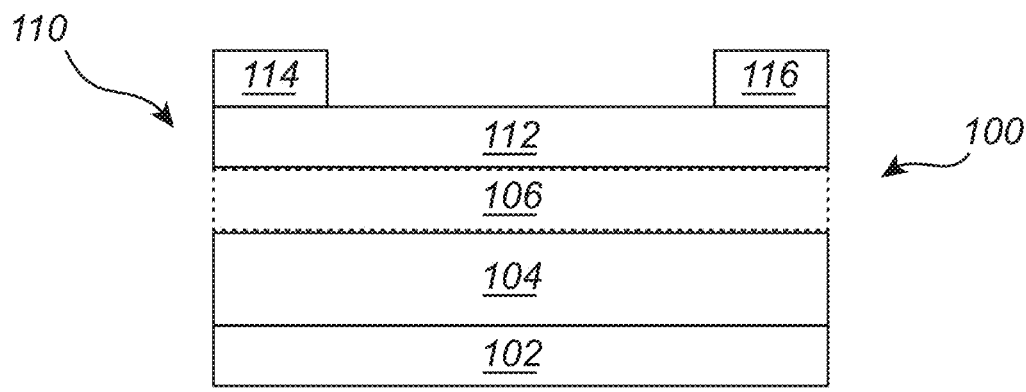

In FIG. 4, subsequent to the heat treatment, the sacrificial stressor layer 108 is removed from the layer stack 110. In FIG. 5, a 2D material channel layer 112 is formed in the layer stack 110, thus replacing the sacrificial stressor layer 108. A source contact 114 and a drain contact 116 are been formed on the 2D material channel layer 112. A FeFET device 100 has thus been formed.

The gate structure 102 may be a gate electrode formed by a conductive material. The conductive material may be a metal, for instance TiN, TaN or TiTaN. Further examples include TiC, TaC, Ru, W, TiW or Pt. The gate structure 102 may also be formed by a number of layers of the aforementioned metal materials, or alloys thereof. Further gate conductor materials are however also possible based on the device application. The gate structure 102 may alternatively be a sacrificial or dummy gate structure, for instance of polysilicon or some other conventional sacrificial or dummy gate material. The gate structure 102 may then be removed, e.g., selectively removed relative to the layers of the stack 110, and replaced with a replacement gate structure, which may include a gate electrode as described above.

The ferroelectric layer 104 is formed on the gate structure 102. The ferroelectric layer 104 may be formed over or on, e.g., directly on, the gate structure 102, e.g., with no layers intermediate the ferroelectric layer 104 and the gate structure 102. The ferroelectric layer 104 may be a hafnium oxide layer ($HfO_2$), a zirconium oxide layer ($ZrO_2$), a hafnium titanate layer (e.g., hafnium titanium oxide $Hf_xTi_{1-x}O_2$) or a layer of hafnium zirconium oxide (e.g., $Hf_xZr_{1-x}O_2$). The ferroelectric layer 104 may also be formed as a composite layer of two or more of the aforementioned layers. The ferroelectric layer 104 may be formed by atomic layer deposition (ALD). The ferroelectric layer 104 may be formed with a thickness in the range of 2 nm to 20 nm, preferably 2 nm to 8 nm. The thickness can be critical to keep the leakage current density and the gate capacitance at levels according to device specifications or requirements. To facilitate obtaining sufficiently strong ferroelectric properties, a ferroelectric layer 104 of e.g. $HrO_2$ or $ZrO_2$ may be doped. Possible dopants include Si, Ge, Al, Ga, Ba, Sr, Y, Sc or any lanthanoid elements. A doping concentration may advantageously be 7% or below in cations. The ferroelectric layer 104, for instance may be doped in situ or during the deposition thereof. However, other compositions of a ferroelectric layer are also possible, for instance $(Pb,Zr)TiO_3$ or $SrBi_2Ta_2O_9$, e.g. with a layer thickness in the range of 10 nm to 200 nm, depending on among others the amount of gate capacitance required in the transistor device to be formed.

The high-K dielectric layer 106 may be formed directly on the ferroelectric layer 104. The high-K dielectric layer 106 may be formed of a high-K dielectric material layer. When present, the high-K dielectric layer 106 may be formed of a material that is the same or different compared to the ferroelectric layer 104. The high-K dielectric layer 106 may include or be formed of a $HfO_2$ layer, a $ZrO_2$ layer, a $HfTiO_4$ layer or a combination or a mixture thereof. The high-K dielectric layer 106 may be formed by ALD or some other suitable conventional vapor phase deposition process.

The sacrificial stressor layer 108 (hereinafter the stressor layer 108) is formed on the ferroelectric layer 104. The stressor layer 108 may be formed directly on the ferroelectric layer 104. However, when the high-K dielectric layer 106 is present in the layer stack 110 the stressor layer 108 may be formed on the ferroelectric layer 104 with the high-K dielectric layer 106 as an intermediate layer. In the latter case, the stressor layer 108 may be formed directly on the high-K dielectric layer 106.

The stressor layer 108 may be formed of a metal layer. The metal layer may be a layer of any of the metal materials mentioned in connection with the gate electrode, such as TiN, TaN, TiTaN or a combination thereof. The metal layer may be formed by ALD, CVD or physical vapor deposition (PVD). The stressor layer 108 may as a non-limiting example be formed with a thickness in the range of 2 nm to 40 nm.

The heat treatment H may comprise heating the ferroelectric layer 104 and the stressor layer 108 to a temperature in a range of 300° C. to 1200° C., preferably 500° C. to 1000° C., more preferably 600° C. to 900° C. The layer stack 110 may for instance be heated by convection in a furnace or an oven with an ambient chamber temperature in the aforementioned ranges. Alternatively, the layer stack 110 may be heated radiatively by through a heated chamber wall, a heating element or a lamp. Alternatively, the ferroelectric layer 104 may be heated to a temperature in the aforementioned ranges by conduction, e.g., by bringing a heater element such as a susceptor or a chuck into abutment with the layer stack 110 or with a substrate having the layer stack 110 formed thereon. The heat treatment H may have a duration of about 1 minute. However, both shorter and longer durations are also possible, depending on among others the thickness of the ferroelectric layer 104. The heat treatment may also be in the form of so-called spike annealing (with a typical duration of about 1 second). Alternatively, very rapid techniques such as laser annealing with a sub-second duration (e.g. milliseconds down to sub-microseconds) may be employed. Regardless of the form of heat treatment, the heat treatment may be adapted to supply a sufficient thermal budget to the ferroelectric layer 104 such that the ferroelectric layer (i.e. the material forming the ferroelectric layer 104) may transition to a ferroelectric state, e.g., by crystallizing into the ferroelectric state. In some embodiments, the ferroelectric layer 104 may already in a ferroelectric state and/or crystalline state, and the heat treatment can increase the magnitude of ferroelectricity. The ferroelectric layer 104 may thereby be provided with the desired ferroelectric properties (at least subsequent to allowing the ferroelectric layer 104 to assume a temperature below the Curie temperature of the ferroelectric material). The particular structure of a ferroelectric material corresponding to the ferroelectric phase may depend on the type of ferroelectric material. By way of example, the ferroelectric phase of $HfO_2$ and $ZrO_2$ corresponds to an orthorhombic phase, for instance.

As one non-limiting example, a layer stack 110 including an 8 nm thick ferroelectric layer 104 formed of $HfO_2$ and a 10 nm thick stressor layer 108 formed of TiN may be heated (e.g., in an oven) to about 800° C. for a duration of 1 minute. As another non-limiting example, a layer stack 110 including a similar layer configuration may be subjected to heat treatment by laser annealing heating the ferroelectric layer 104 to about 950° C. for a duration of a few milliseconds.

Subsequent to the heat treatment H, the stressor layer 108 may be removed from the layer stack 110 by etching the stressor layer 108, e.g., selectively etching relative to the ferroelectric layer 104 (and the high-K dielectric layer 106 if present). A metal stressor layer 108 may be removed using a suitable wet etch, in some implementations. Alternatively, in other implementations, a dry etch process such as a reactive ion etch (RIE) may be used to remove a metal stressor layer 108.

Subsequent to removing the stressor layer 108, the 2D material channel layer 112 (hereinafter the channel layer 112) is formed on the ferroelectric layer 104. The channel layer 112 may be formed directly on the ferroelectric layer 104. However, in embodiments where the high-K dielectric layer 106 is present in the layer stack 110, the channel layer 112 may be formed on the ferroelectric layer 104 with the high-K dielectric layer 106 as an intermediate layer. In these embodiments, the channel layer 112 may be formed directly on the high-K dielectric layer 106.

In some embodiments, the channel layer 112 may be formed of one or more mono-layers of graphene. A suitable method for forming a graphene channel layer 112 on the ferroelectric layer 104 may be employed. For instance, a graphene layer of one or more monolayers of graphene may be grown on a template substrate and subsequently transferred to the layer stack 110 using a layer transfer process. Alternatively, graphene flakes of one or more monolayers of graphene may be formed by exfoliation wherein a graphene flake may be transferred to the layer stack 110.

The channel layer 112 may alternatively be formed of one or more mono-layers of a transition metal dichalcogenide (TMDC) material, which can either be monocrystalline or polycrystalline. A TMDC monolayer, which can be denoted as $MX_2$, includes or consists of a layer of M atoms sandwiched between two layers of X atoms, where M denotes a transition metal element and X denotes a chalcogen element. A TMDC layer may be formed by a number of TMDC monolayers stacked on each other. The channel layer 112 may be formed of one or more mono-layers of $WS_2$, $WSe_2$, $MoS_2$, $MoSe_2$, $WTe_2$ or $MoTe_2$. Any state of the art method for forming a TMDC channel layer 112 on the ferroelectric layer 104 may be employed. For instance, TMDC flakes may be formed by exfoliation wherein a TMDC flake may be transferred to the layer stack 110. Other alternatives for producing TMDC layers include atomic layer deposition (ALD), chemical vapor deposition (CVD), physical vapor deposition (PVD), pulsed laser deposition (PLD) and molecular beam epitaxy (MBE), e.g., solid source MBE.

The source contact 114 and the drain contact 116 may be formed to contact the channel layer 112, at opposite sides of a channel region in the channel layer 112. The contacts 114 and 116 may be formed by a conductive material. The conductive material may be a metal, for instance Ti, TiN, TiAl, or WN. However, W, Co, Ni, Ru or alloys thereof are also possible contact materials as well as a silicide and a germanide. The contact material may be formed using a suitable technique such as ALD, CVD or PVD. A mask layer may be formed to cover the channel layer 112 and opened at the intended positions of the contacts 114, 116 prior to deposition of the contact material. After the contacts have been formed, the mask layer may be removed.

Figure 6:
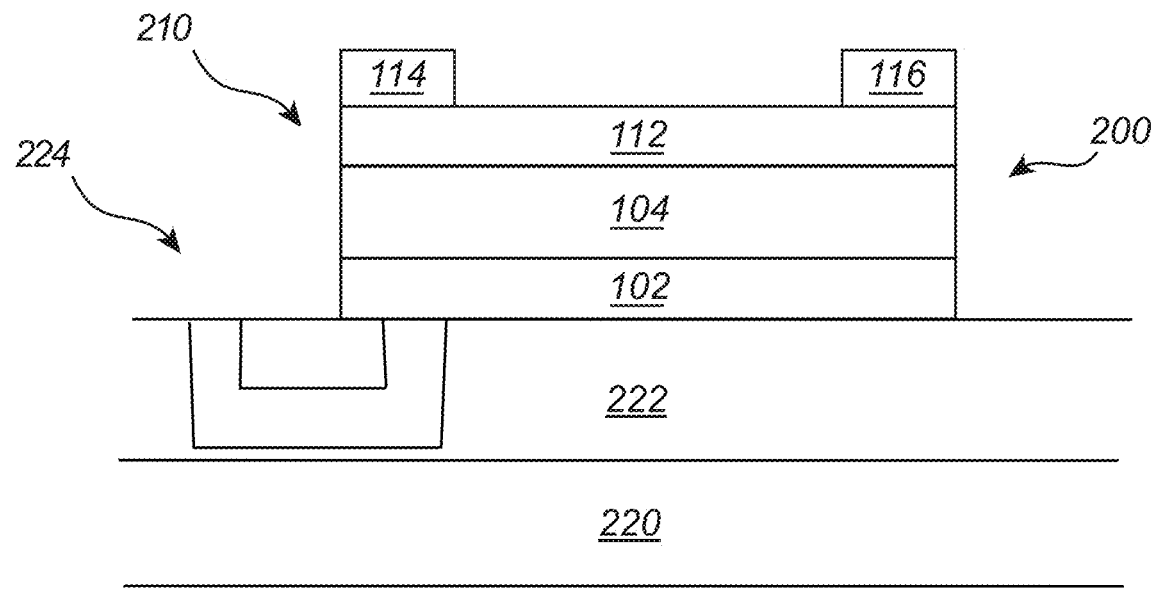
FIG. 6 and FIGS. 7a and 7b schematically illustrate two different alternative FeFET device configurations.

FIG. 6 shows a FeFET device 200 including a layer stack 210 arranged in a vertical layer stack configuration, also referred to as a bottom-up configuration, according to some embodiments. The device 200 includes a layer stack 210 which has been formed in the manner described above with reference to FIGS. 1-5.

The layer stack 210 includes a gate structure 102 in the form of a gate electrode. The gate structure 210 is arranged on a substrate 220, such as a semiconductor substrate, for instance a Si-substrate, a Ge-substrate, a SiGe-substrate, a silicon-on-insulator (SOI) substrate. An insulating layer 222, of for instance a conventional dielectric material, may formed on a main surface of the substrate 220 to electrically insulate the gate structure 102 from the substrate 220, in some embodiments. An upper surface of the gate structure 102 (on which the ferroelectric layer 104 is formed) extends along a (horizontal) plane parallel to the main surface of the substrate 220. A ferroelectric layer 104 and a channel layer 112 are formed above the gate structure 102, as seen in a vertical direction (i.e. normal to the main surface of the substrate 220). Prior to being replaced by the channel layer 112, also a stressor layer (corresponding to stressor layer 108) has been formed above the gate structure 102 and above the ferroelectric layer 104.

A source electrode 114 and a drain electrode 116 are formed in electrical contact with the channel layer 112. To form the source and drain electrodes 114, 116, a mask layer may be formed above the layer stack 210 and the substrate 220. Openings may be defined in the mask layer (e.g. in a lithographic process) to expose regions of the channel layer 112 where the source and drain electrodes 114, 116 are to be formed. A conductive material may subsequently be deposited in the openings. The deposited conductive material may, for instance, be a metal as described in connection with the gate structure 102 illustrated in FIGS. 1 through 5. Following removal of overburden conductive material by chemical mechanical polishing (CMP) and/or etch back, the mask layer may be removed, leaving source and drain electrodes 114, 116 on the channel layer 112.

A conductive interconnect structure 224 may be formed in the insulating layer 222 to provide electrical access to the gate structure 102 via a contact accessible in a region adjacent to the layer stack 210. The interconnect structure 224 may be formed by, e.g., depositing a conductive material such as Al, Cu or W using, for instance, a damascene process, prior to forming the gate structure 102.

Figure 7A:
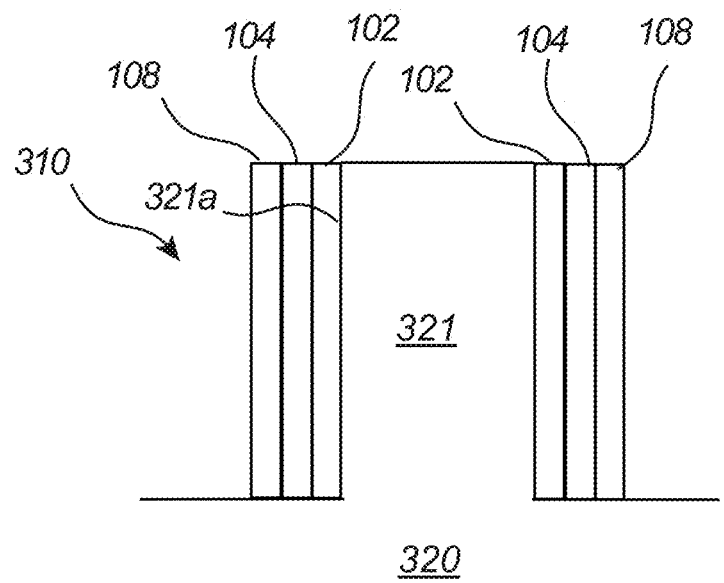

FIG. 7a shows a FeFET including a layer stack 310 arranged in a lateral stacking configuration, according to some other embodiments. The layer stack 310 includes a gate structure 102 which is formed on a sidewall surface 321a of a vertical semiconductor structure 321 extending or protruding from a substrate 320. The structure 321 may, for instance, be in the form of a semiconductor fin, and the resulting FeFET may be a fin FeFET. The gate structure 102 presents a main surface facing away from the sidewall surface 321a and extending along a (vertical) plane parallel to the sidewall surface 321a of the semiconductor structure 321. A ferroelectric layer 104 is formed on the main surface of the gate structure 102. A stressor layer 108 is formed on the ferroelectric layer 104. Thus, the stressor layer 108 is formed laterally outside of the ferroelectric layer 104 as viewed along a normal direction to the sidewall surface 321a. The layers of the layer stack 310 may be deposited in sequence as respective conformal layers covering the substrate 320 and the structure 321. Following the deposition of the layer stack 310, layer portions deposited on horizontal surfaces may be removed by vertical etching, thereby arriving at the configuration shown in FIG. 7a with the layer stack formed on sidewall surfaces of the structure 321.

Figure 7B:
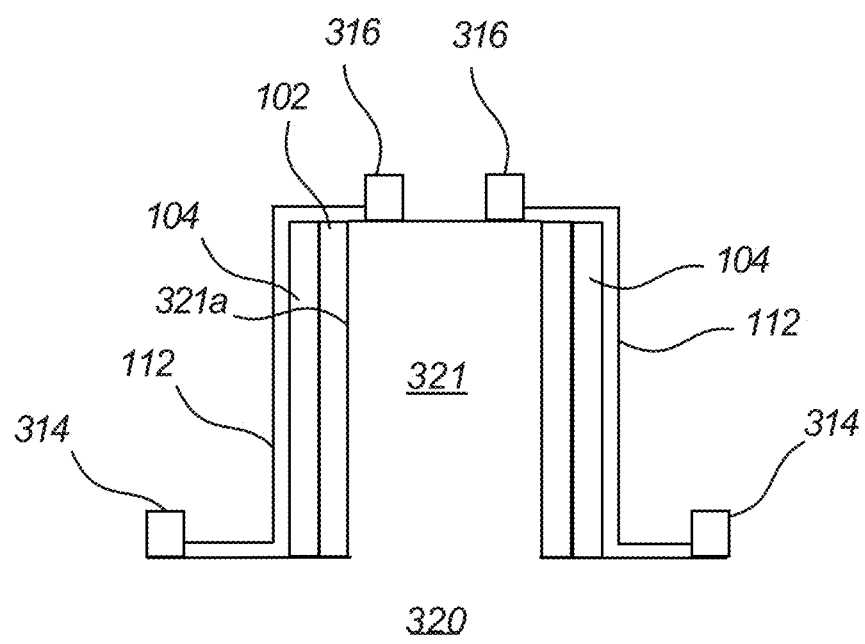

In FIG. 7b, the stressor layer 108 has (subsequent performing a heat treatment H as described above) been replaced by a 2D material channel layer 112. The channel layer 112 may be deposited, e.g., as a conformal layer (for instance by ALD), covering the substrate 320, the ferroelectric layer 104 and the structure 321. Following the deposition of the channel layer 112, channel layer portions deposited on horizontal surfaces (such as on a top surface of the structure 321) may be may be removed by vertical etching, optionally while masking portions of the channel layer 112 which are to remain. Source and drain electrodes 314, 316 may thereafter be formed in electrical contact with the channel layer 112. The source and drain electrodes 314, 316 may be formed in a corresponding manner as described above with respect to the source and drain electrodes 114 and 116 shown in FIG. 6.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A method of fabricating a ferroelectric field-effect transistor (FeFET), the method comprising:
    forming a layer stack on a gate structure, wherein forming the layer stack comprises forming a ferroelectric layer on the gate structure followed by forming a sacrificial stressor layer on the ferroelectric layer;
    heat-treating the layer stack to cause a phase transition in the ferroelectric layer;
    subsequent to heat-treating, replacing the sacrificial stressor layer with a two-dimensional (2D) material channel layer; and
    forming a source contact and a drain contact contacting the 2D material channel layer.

2. The method according to claim 1, wherein the sacrificial stressor layer includes a metal layer.

3. The method according to claim 2, wherein the metal layer includes titanium nitride, tantalum nitride, titanium tantalum nitride or a combination thereof.

4. The method according to claim 1, wherein the ferroelectric layer includes hafnium oxide, zirconium oxide, hafnium titanate, hafnium zirconium oxide or a combination thereof.

5. The method according to claim 1, wherein the 2D material channel layer includes one or more mono-layers of a transition metal dichalcogenide material or one or more mono-layers of graphene.

6. The method according to claim 5, wherein the 2D material channel layer includes one or more mono-layers of $WS_2$, $WSe_2$, $MoS_2$, $MoSe_2$, $WTe_2$ or $MoTe_2$.

7. The method according to claim 1, wherein heat-treating comprises heating the ferroelectric layer at a temperature in a range of 300° C. to 1200° C.

8. The method according to claim 1, wherein the gate structure is formed on a substrate and has an upper surface extending along a plane parallel to a main surface of the substrate, and wherein the layer stack is formed on the upper surface.

9. The method according to claim 1, wherein the gate structure is formed on a substrate having a semiconductor structure extending vertically from the substrate, wherein the semiconductor structure has a sidewall surface on which the gate structure is formed.

10. The method according to claim 1, wherein the gate structure is a sacrificial gate structure and the method further comprises replacing the sacrificial gate structure with a replacement gate structure.

11. The method according to claim 1, wherein the gate structure comprises a gate electrode.

12. The method according to claim 1, wherein forming the layer stack further comprises forming a high-K dielectric layer subsequent to forming the ferroelectric layer.

13. A method of fabricating a ferroelectric field effect transistor (FeFET), the method comprising:
    forming a metal gate on a substrate;
    forming a ferroelectric layer on the metal gate;
    forming a sacrificial metal channel layer on the ferroelectric layer;
    thermally annealing the ferroelectric layer and the sacrificial metal channel layer at a temperature between 300° C. and 1200° C.; and
    replacing the sacrificial metal channel layer with a channel layer formed of a two-dimensional (2D) layered material.

14. The method according to claim 13, wherein the ferroelectric layer is such that thermally annealing increases a degree of ferroelectricity in the ferroelectric layer.

15. The method according to claim 13, wherein the ferroelectric layer is such that thermally annealing induces an amorphous-to-crystalline transition in the ferroelectric layer.

16. The method according to claim 13, wherein the sacrificial metal channel layer is formed of titanium nitride, tantalum nitride, titanium tantalum nitride or a combination thereof.

17. The method according to claim 13, wherein the ferroelectric layer is formed of hafnium oxide, zirconium oxide, hafnium titanate, hafnium zirconium oxide or a combination thereof.

18. The method according to claim 13, wherein the 2D layered material comprises a transition metal dichalcogenide or graphene.

19. The method according to claim 13, wherein the substrate comprises an insulating layer on which the metal gate is formed, and wherein the metal gate is electrically connected by interconnect metallization formed in the insulating layer.

20. The method according to claim 13, wherein the substrate comprises a fin having sidewalls on which the metal gate is formed.

* * * * *

UNITED STATES PATENT AND TRADEMARK OFFICE
CERTIFICATE OF CORRECTION

PATENT NO. : 10,672,894 B2
APPLICATION NO. : 16/216833
DATED : June 2, 2020
INVENTOR(S) : Jan Van Houdt Page 1 of 1

It is certified that error appears in the above-identified patent and that said Letters Patent is hereby corrected as shown below:

On the Title Page

Item [74], delete "Knobbe, Martens, Olson & bear LLP" and insert --Knobbe, Martens, Olson & Bear, LLP--.

In the Specification

In Column 1, Line 39, delete "materials (TMDCs)" and insert --(TMDC) materials--.

In Column 8, Line 60, delete "may be may be" and insert --may be--.

In the Claims

In Column 10, Line 10 (Approx.), Claim 13, delete "field effect" and insert --field-effect--.

Signed and Sealed this
Twentieth Day of October, 2020

Andrei Iancu
*Director of the United States Patent and Trademark Office*